United States Patent
Surthi

(10) Patent No.: US 7,989,360 B2
(45) Date of Patent: Aug. 2, 2011

(54) SEMICONDUCTOR PROCESSING METHODS, AND METHODS FOR FORMING SILICON DIOXIDE

(75) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 427 days.

(21) Appl. No.: 11/970,369

(22) Filed: Jan. 7, 2008

(65) Prior Publication Data

US 2009/0176379 A1 Jul. 9, 2009

(51) Int. Cl.
*H01L 21/31* (2006.01)
(52) U.S. Cl. .......................... 438/778; 257/701
(58) Field of Classification Search .................. 438/778
See application file for complete search history.

(56) References Cited

U.S. PATENT DOCUMENTS

| | | |
|---|---|---|
| 6,818,250 B2 | 11/2004 | George et al. |
| 6,838,114 B2 | 1/2005 | Carpenter et al. |
| 7,186,582 B2 | 3/2007 | Todd |
| 7,253,434 B2 | 8/2007 | Golovchenko |
| 2005/0000937 A1 | 1/2005 | Chiang et al. |
| 2006/0008942 A1 | 1/2006 | Romano et al. |
| 2006/0151845 A1 | 7/2006 | Govindarajan |
| 2006/0228897 A1 | 10/2006 | Timans |
| 2007/0074663 A1 | 4/2007 | Brailove et al. |
| 2008/0085612 A1* | 4/2008 | Smythe et al. ............... 438/787 |
| 2009/0016406 A1* | 1/2009 | Ravi et al. ...................... 374/159 |
| 2009/0085082 A1* | 4/2009 | Dewey et al. ................. 257/297 |

OTHER PUBLICATIONS

U.S. Appl. No. 11/891,575, filed Aug. 10, 2007, Surthi.
"Manufacturing Processes—Coating Surface Finishing" Engineer's Hand Book http://www.engineershandbook.com/MfgMethods/cvd.htm reprinted Jan. 7, 2008.
Jae-Eun Park, et al. "Mass-Productive Ultra-Low Temperature ALD $SiO_2$ Process Promising for Sub-90nm Memory and Logic Devices" IEEE Feb. 2002.

* cited by examiner

Primary Examiner — Quoc D Hoang
Assistant Examiner — Tony Tran
(74) Attorney, Agent, or Firm — Wells St. John P.S.

(57) ABSTRACT

Some embodiments include methods for semiconductor processing. A semiconductor substrate may be placed within a reaction chamber. The semiconductor substrate may have an inner region and an outer region laterally outward of said inner region, and may have a deposition surface that extends across the inner and outer regions. The semiconductor substrate may be heated by radiating thermal energy from the outer region to the inner region. The heating may eventually achieve thermal equilibrium. However, before thermal equilibrium of the outer and inner regions is reached, and while the outer region is warmer than the inner region, at least two reactants are sequentially introduced into the reaction chamber. The reactants may together form a single composition on the deposition surface through a quasi-ALD process.

13 Claims, 6 Drawing Sheets

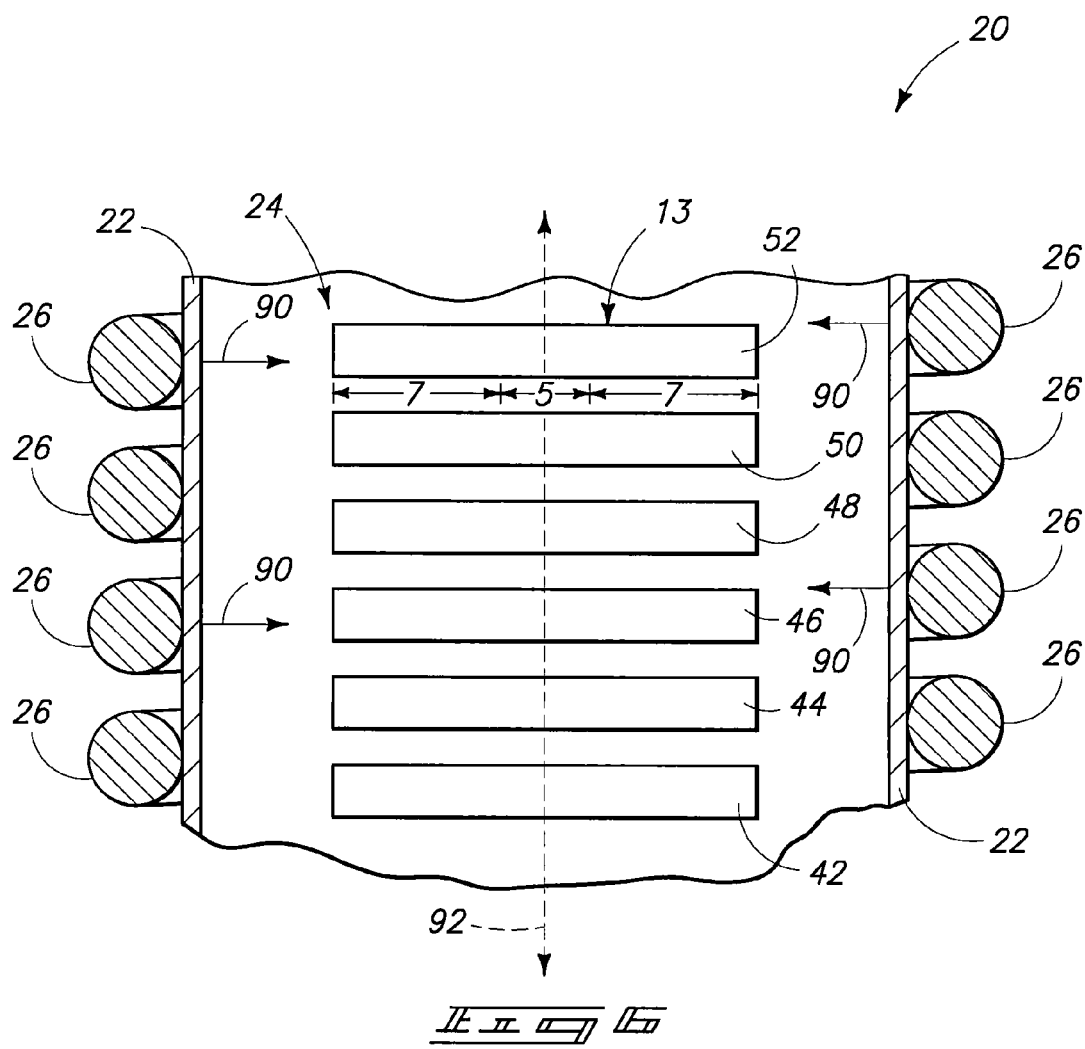
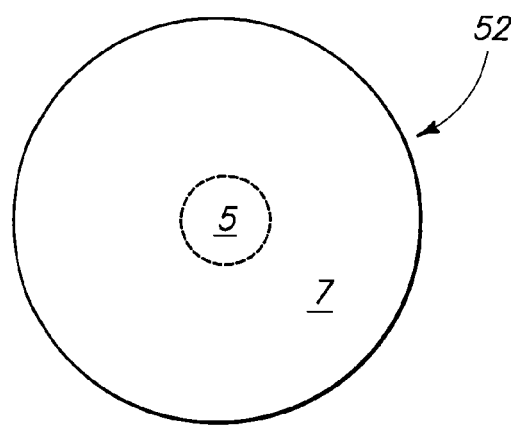

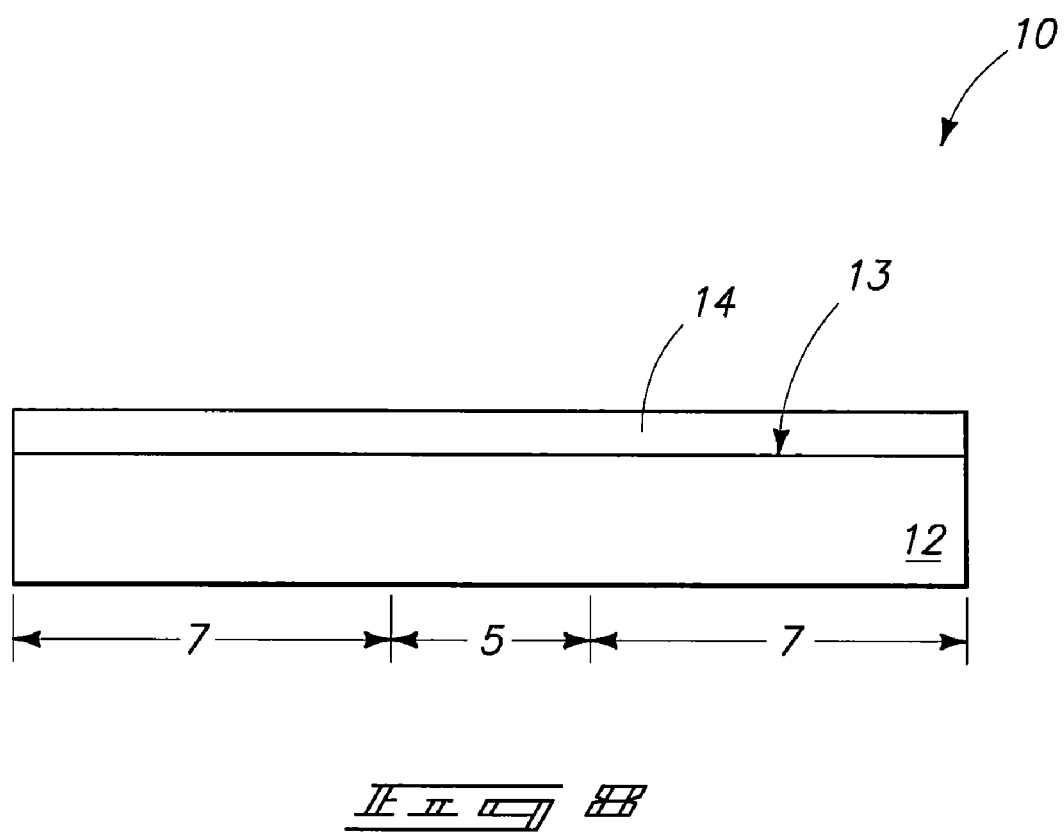

US 7,989,360 B2

SEMICONDUCTOR PROCESSING METHODS, AND METHODS FOR FORMING SILICON DIOXIDE

TECHNICAL FIELD

Methods for semiconductor processing, and methods for forming silicon dioxide.

BACKGROUND

Layers are often formed over semiconductor substrates, e.g., wafers, during semiconductor device fabrication. Among the materials which may be included in such layers are tantalum pentoxide, titanium nitride, titanium silicon nitride, tantalum nitride, tantalum silicon nitride, titanium silicide, tantalum silicide, tungsten nitride, aluminum oxide, hafnium oxide, zirconium oxide, silicon nitride, silicon dioxide, elemental tungsten and elemental titanium. Example methods for forming such layers are chemical vapor deposition (CVD) and atomic layer deposition (ALD).

CVD includes mixing two or more reactants in a chamber to form a material which subsequently deposits across exposed surfaces of a substrate. In CVD processes, it may be difficult to control reactions between the reactants provided in the chamber, and various side reactions may occur. The side reactions may generate contaminants. Additionally, it may be difficult to form a uniform layer over multiple exposed surfaces of one or more substrates with CVD. For instance, chemical vapor deposition of material may be faster across some regions of semiconductor topography relative to others, which may lead to within wafer (WIW) non-uniformity.

ALD may overcome some of the problems discussed above relative to CVD. ALD processing includes forming thin films of material by repeatedly depositing monoatomic layers.

ALD processes may involve introduction of a first reactant which reacts with a substrate to form a monolayer across the substrate. The first reactant may react with the substrate, but not with itself. Accordingly, side-reactions may be reduced or eliminated. Further, the reaction of the reactant with the substrate can be self-limiting. Thus, once a monolayer forms across exposed surfaces of the substrate there may be no further reaction of the reactant with the substrate.

In ALD processes, after the monolayer is formed, the excess first reactant may be evacuated from the reaction chamber via a purge process, and a second reactant may be subsequently introduced. A purge process may include one or more purge steps in which a purge gas is introduced into the reaction chamber. A purge process may also include one or more pumping steps preceding and/or following introduction of the purge gas to remove excess reactant, catalyst, purge gas, and/or by-product gases from the chamber.

In ALD processes, the second reactant may react with the monolayer of material formed from the first reactant to convert such monolayer into a desired material layer over the substrate. The desired material layer may have a relatively uniform thickness across the various surfaces of the substrate.

Depending on the reactant system and with long enough pump and/or purge time, an ALD process may produce very uniform thickness across a wafer regardless of topography. However, ALD processing may have significantly lower throughput as compared to CVD processing techniques. To improve the throughput associated with ALD processes, the purge process may be shortened by using shorter pump and/or purge times between reactant pulses. In some cases, the deposition rate associated with ALD processing may be improved by increasing or decreasing the process temperature. Also, ALD throughput may be improved by processing a plurality of wafers simultaneously in a batch process.

Performing batch processes, increasing or decreasing the process temperature, and/or shortening pump and/or purge times may, however, lead to an added CVD component associated with an ALD process (in other words, may lead to the process being a mixed ALD/CVD process). A process which is primarily ALD, but which has some CVD occurring therein, may be referred to as a quasi-ALD process. The CVD process characteristics of a quasi-ALD process may increase throughput of the process, but may also lead to problems with WIW uniformity.

A prior problem may be that the wafers being treated by a quasi-ALD process need a long time to stabilize to a process temperature (especially at lower temperatures, such as temperatures of from 75° C. to 125° C.), and yet it is important to avoid overshooting a target temperature (as overshoot may damage structures or materials on the wafers). Thus, slow, controlled heating is utilized. If deposition is started at a lower temperature, the CVD component may lead to a thickness profile of the type shown in FIG. 1. Specifically, FIG. 1 shows a construction 10 illustrating a thickness profile of a material 14 formed on a semiconductor substrate 12 utilizing prior art quasi-ALD processing.

Material 14 may comprise any material that can be deposited by an ALD process, and may, for example, correspond to an oxide, such as $Al_2O_3$, $TiO_2$, $ZrO_2$, $HFO_2$, $Ta_2O_5$, $Nb_2O_5$, $CeO_2$, $SiO_2$, $In_2O_3$, or $IrO_2$; a nitride; a metal or a silicide. For instance, material 14 may comprise silicon dioxide formed by ALD utilizing a silicon-containing precursor (for instance, $Si_2Cl_6$), an oxygen-contain precursor (for instance, $H_2O$), and a pyridene catalyst.

The substrate 12 has an inner (or central) region 5, and outer regions laterally outward from such inner region. The inner and outer regions are defined by their relative location to one another on substrate 12, and not by discrete physical differences in composition that may or may not exist between the inner and outer regions.

The material 14 has a non-uniform thickness profile, and specifically is thicker over the outer regions 7 of substrate 12 than over the inner region 5 of such substrate. The difference between the maximum and minimum thicknesses of layer 14 (in other words, the thickness variance) may be used as a measure of WIW uniformity. The thickness variance is indicated in FIG. 1 by a distance 15.

The WIW uniformity of a layer may be determined based on a measured thickness of the layer at a number of different points across a semiconductor substrate. The WIW uniformity may be proportional to the difference between a maximum thickness measurement and a minimum thickness measurement. Under such definition, WIW uniformity measurements closer to zero indicate a layer having a more uniform thickness profile.

It is desired to develop methods for improving WIW uniformity, while also achieving high throughput of deposition processes.

BRIEF DESCRIPTION OF THE DRAWINGS

FIG. 6 is a diagrammatic cross-sectional view of an apparatus that may be utilized in an embodiment, with such apparatus shown containing a plurality of semiconductor substrates.

FIG. 7 is a diagrammatic, top view of one of the semiconductor substrates present in FIG. 6.

FIG. 8 is a diagrammatic, cross-sectional view of a semiconductor substrate processed in accordance with an embodiment.

DETAILED DESCRIPTION OF THE ILLUSTRATED EMBODIMENTS

Some embodiments include methodology by which ALD processing may be improved by controlling and/or compensating for one or more CVD processes that may be associated with quasi-ALD processing.

In some embodiments, ALD processing is utilized to form one or more layers over a semiconductor substrate, and a temperature differential is provided across the substrate during at least some of the ALD processing. In some embodiments, a stack of semiconductor substrates are simultaneously treated by ALD processing, and at least one temperature differential is provided within the stack during at least some of the ALD processing. The temperature differentials induced on single substrates, or stacks of substrates, may be induced from heating coils provided around sidewalls of a chamber that contains one or more substrates during ALD processing, and/or may be induced by heating ALD reactants prior to introducing such reactants into a chamber that is at a cooler temperature than the reactants; and/or may be induced by heating one or both of purge gases and carrier gases.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
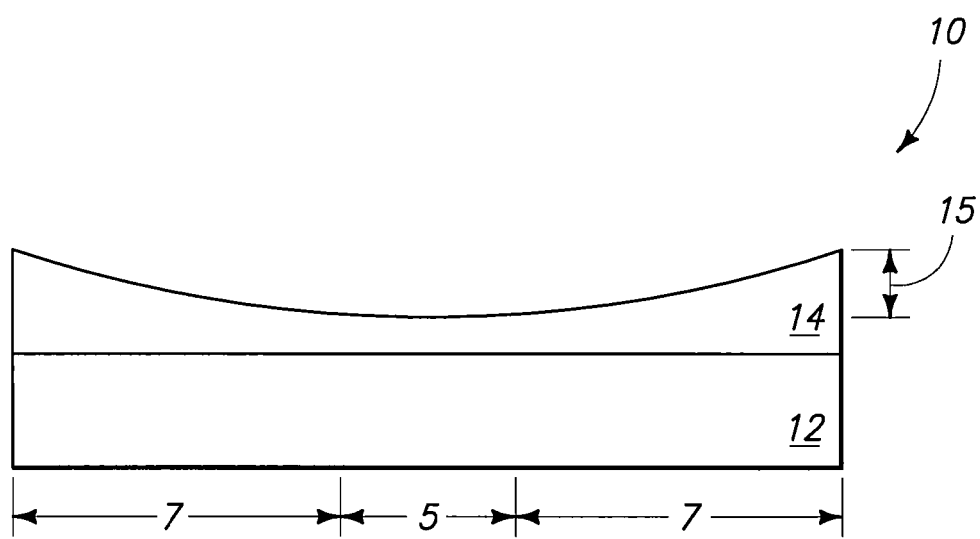
FIG. 1 is a diagrammatic, cross-sectional view of a semiconductor substrate processed in accordance with a prior art method utilizing a quasi-ALD process.

In some embodiments, it is recognized that the non-uniform thickness profile of material 14 of prior art FIG. 1 (specifically, the edge-thick profile) may be the result of the CVD component of a quasi-ALD process. For instance, the edge-thick profile may be the result of reactant gradients associated with the direct reaction between an amount of residual first ALD reactant and a subsequent pulse of a second ALD reactant in a deposition chamber. In other words, even though an ALD process is intended to have reactants introduced sequentially and at non-overlapping times relative to one another in a reaction chamber, in practice a residual amount of one reactant may remain in the chamber to react with the subsequently introduced next reactant; and the residual first reactant may form a concentration gradient within the chamber. The residual amount may be left in the chamber due to inadequate purging of the first reactant, which may result from a desire to maintain high throughput through an ALD process offsetting a desire to ensure that a first reactant is entirely removed prior to introduction of the next reactant. The CVD process may have one or both of two primary origins. Specifically, it may result from a lower temperature of deposition rendering it difficult to evacuate water from the system, and/or it may result from inefficient removal of reactants during a pump/purge cycle.

If there is a CVD process occurring concurrently with an ALD process, the CVD process may have a higher deposition rate than the ALD process. Accordingly, the deposition rate may be slower across regions having only ALD processes relative to regions having CVD processes occurring in addition to the ALD processes. Any concentration of residual first reactant is often higher at edges of the semiconductor substrates within a chamber than at the central regions of the semiconductor substrates. This may lead to higher deposition rates at the edges of the semiconductor substrates than at the central regions of the semiconductor substrates, and accordingly to the edge-thick profile of FIG. 1. Additionally, in some systems, deposition rate may be faster at lower temperatures than at higher temperatures due to a higher rate of desorption occurring at higher temperatures.

The CVD part of a quasi-ALD process may provide an advantage in that throughput of the ALD process may be increased if there is a CVD process providing higher deposition rates, and/or if purge times may be reduced. However, if the CVD process cannot be adequately controlled, the WIW uniformity may be poor.

One method of controlling a CVD part of a quasi-ALD process is to utilize temperature to affect the balance between the CVD process and the ALD process. In some reaction systems, an increase in temperature will decrease the rate of deposition from the CVD part of the quasi-ALD process relative to the rate of deposition of the ALD part of the quasi-ALD process. Thus, some embodiments comprise creating a temperature differential across a semiconductor substrate during a deposition process such that edges of the substrate are warmer than a central region of the substrate.

Figure 2:
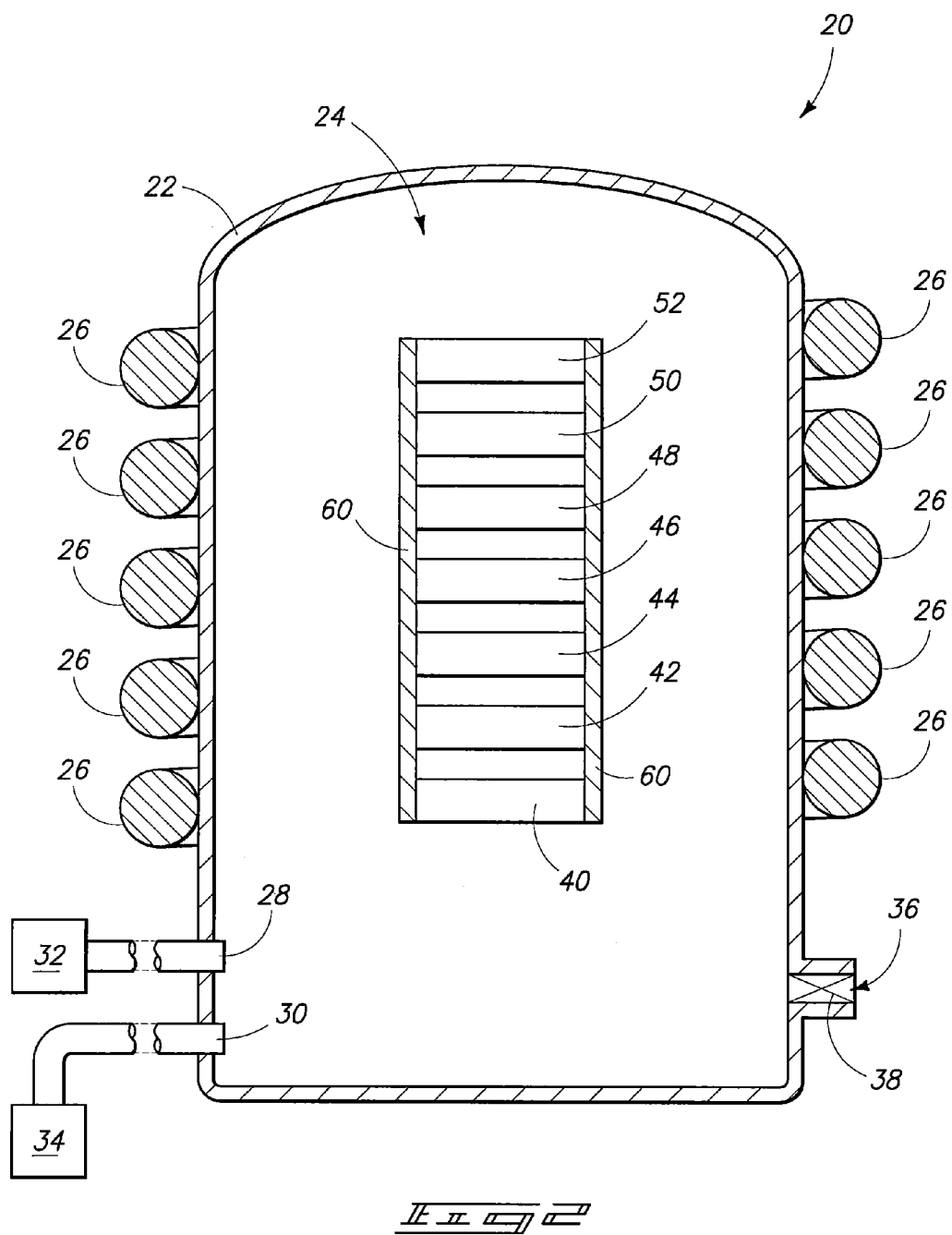
FIG. 2 is a diagrammatic cross-sectional view of an apparatus that may be utilized in an embodiment, with such apparatus shown containing a plurality of semiconductor substrates.

FIG. 2 illustrates a heating apparatus 20 that may be utilized in some embodiments. The heating apparatus includes a sidewall 22 extending around a chamber 24. A plurality of heating elements (which may also be referred to herein as heating modules) 26 extend around the sidewall and are utilized for increasing a temperature within the chamber. The heating elements appear to be two sets of five vertically offset elements in the cross-sectional view of FIG. 2. However, the heating elements may actually surround the chamber 24 so that there are actually five vertically offset heating elements, and accordingly horizontally-aligned pairs may be two parts of the same heating element as one another. Although five heating elements are shown, in other embodiments there may be less than five heating elements (and in some embodiments there may be only a single heating element), or more than five heating elements.

A pair of gas inlet tubes 28 and 30 are shown extending through the sidewall 22. The gas inlet tubes are utilized for providing reactants and/or purge gases into the reaction chamber. Although two gas inlet tubes are shown, in other embodiments there may be more than two gas inlet tubes, or only a single gas inlet tube. Also, the gas inlet tubes may be located at different positions of the heating apparatus than the shown position. In some embodiments, a gas inlet tube is formed as a multi-hole injector extending vertically along the stack of substrates. The number of openings in the gas inlet tube is proportional to the number of semiconductor substrates, with the openings being provided at the same pitch as the semiconductor substrates so that there is a one-to-one correspondence of the openings with the semiconductor substrates.

The gas inlet tubes may have heating elements (not shown) associated therewith so that gases flowed through the inlet tubes are heated prior to delivery into chamber 24.

Gas inlet tubes 28 and 30 are shown to be in fluid connection with reservoirs 32 and 34, respectively. Such reservoirs may correspond to any receptacle from which gas may be delivered to the inlet tubes 28 and 30. For instance, one or both of the reservoirs may correspond to a tank of gas; and/or one or both of the reservoirs may correspond to a container holding volatile liquid or sublimable solid. If a reservoir comprises volatile liquid or sublimable solid, there may be a heating unit associated with the reservoir to heat such liquid or solid, and/or there may be structures associated with the reservoir to enable carrier gas to be flowed across the volatile liquid (or sublimable solid) to extract volatized material from the liquid (or solid).

An outlet 36 extends through sidewall 22, and a valve 38 is diagrammatically illustrated to be provided within the outlet. The outlet may be in fluid communication with a pump (not shown). Flow of materials through the outlet may be controlled by operation of the pump and valve 38 so that pressure within chamber 24 may be controlled, and so that gaseous materials may be exhausted from the chamber during and/or after a deposition process.

A plurality of semiconductor substrates 40, 42, 44, 46, 48, 50 and 52 are retained within a holding structure 60 and placed within chamber 24. The semiconductor substrates may, for example, correspond to silicon wafers. The holding structure 60 may correspond to a structure known in the art as a "boat". The semiconductor substrates are together a batch of substrates provided in the chamber, and in practice the batch may comprise from about 100 to about 150 semiconductor substrates.

In the shown embodiment, the chamber 24 and the semiconductor substrates 40, 42, 44, 46, 48, 50 and 52 are laterally surrounded by the heating elements 26.

The heating apparatus 20 may correspond to a furnace which is loaded by inserting the boat 60, containing the batch of semiconductor substrates, upwardly through a door in the bottom of the furnace. Subsequently, the door can be closed to seal the batch of semiconductor substrates within the furnace.

The heating apparatus 20 may be utilized for an ALD process and/or a quasi-ALD process. Specifically, a first reactant may be flowed into chamber 24 through tube 28 to form a first layer across surfaces of the substrates 42, 44, 46, 48, 50 and 52. Most or all of any unreacted first reactant may then be purged from the chamber, and subsequently a second reactant may be flowed into the chamber through tube 30 to convert the first layer to a desired material.

Figure 3:
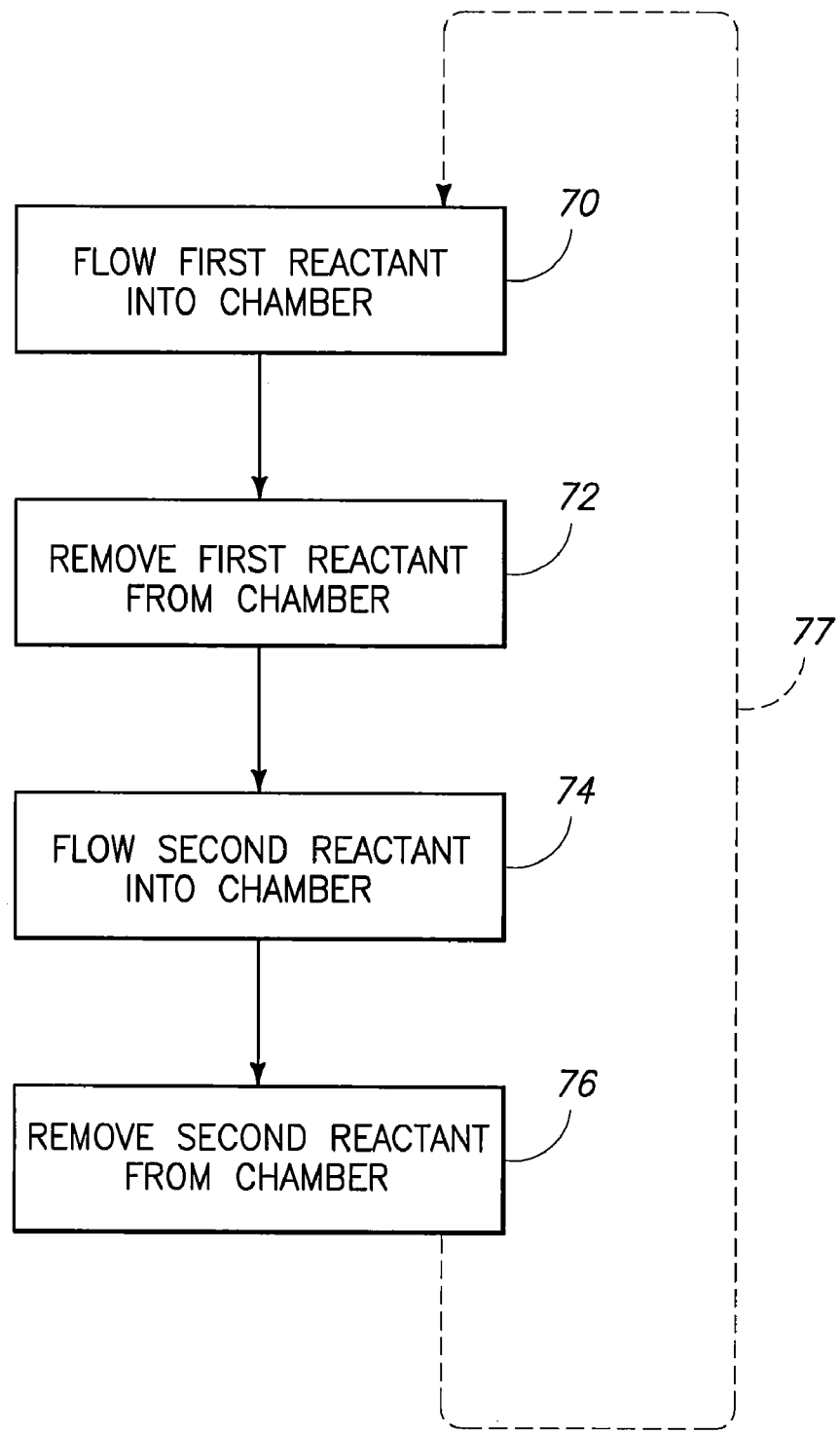
FIG. 3 is a flow chart diagram of an example embodiment.

FIG. 3 is a flow chart diagram of a process of an example embodiment. The process comprises sequential flows of a pair of separate reactants, and may be an ALD process or a quasi-ALD process.

In a first step 70, a first reactant is flowed into a reaction chamber. The first reactant reacts with one or more substrate surfaces within the chamber to form a first layer.

In a next step 72, the first reactant is removed from the chamber. Such removal may comprise one or both of flowing purge gas through the chamber and utilization of a pump to reduce pressure in the chamber.

In a third step 74, a second reactant is flowed into the chamber. The second reactant may react with the layer formed from the first reactant to convert such layer to a desired material. For instance, the first reactant may comprise a silicon halide and be utilized to form a silicon halide-containing layer over a semiconductor substrate. The second reactant may comprise oxygen (and may, for example, correspond to water) and be utilized to convert the silicon halide-containing layer to silicon dioxide. In some embodiments, a pyridene catalyst may be flowed into the reaction chamber together with one or both of the first and second reactants.

In a fourth step 76, the second reactant is removed from the chamber. Such removal may comprise one or both of flowing purge gas through the chamber and utilization of a pump to reduce pressure in the chamber.

The processing of steps 70, 72, 74 and 76 may be considered one iteration of a process for ALD (or quasi-ALD) formation of the material. Multiple iterations of the process may be performed (as represented by dashed line 77) to form the material to a desired thickness.

If all of the first reactant is removed at step 72, and all of the second reactant is removed at step 76, the process of FIG. 3 may be strictly an ALD process. If, however, some of the first reactant remains in the chamber during the flow of the second reactant into the chamber at step 74, and/or some of the second reactant from one iteration remains in the chamber during the flow of first reactant into the chamber during a subsequent iteration of step 70, the process of FIG. 3 may correspond to a quasi-ALD process.

In some embodiments, the processing step 70 and the processing step 74 may be considered to be separate and substantially discrete steps relative to one another, with both processing steps being part of a deposition sequence for forming a single composition (for instance, silicon dioxide). The steps are separate and substantially discrete relative to one another in that they occur at different times, and with little or no overlap. There will be no overlap between steps 70 and 74 if the deposition sequence is strictly ALD so that none of the first reactant is present in the chamber with the second reactant, and vice versa. There will be minor overlap between steps 70 and 74 if the deposition sequence is a quasi-ALD process so that some of the first reactant remains in the chamber as the second reactant is flowed into the chamber, and/or some of the second reactant remains in the chamber as the first reactant is flowed into the chamber.

Figure 4:
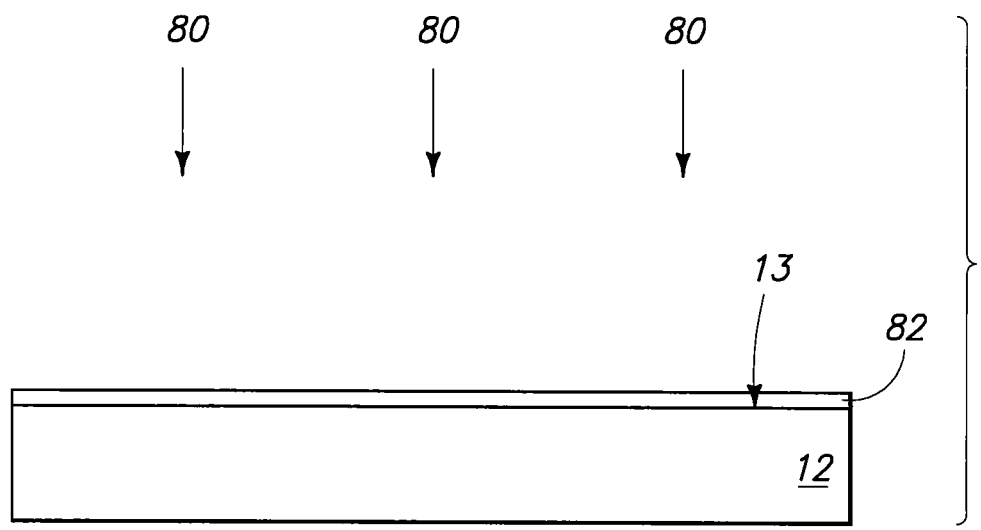
FIGS. 4 and 5 are diagrammatic cross-sectional views of a semiconductor substrate processed in accordance with an embodiment.
Figure 5:
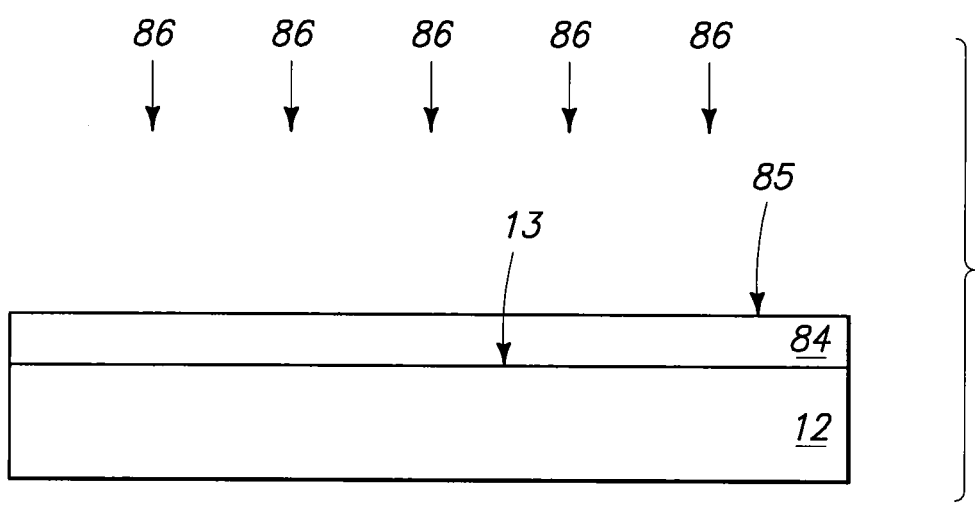

FIGS. 4 and 5 diagrammatically illustrate a process that may be an ALD process or a quasi-ALD process.

FIG. 4 shows a substrate 12 exposed to a first reactant 80 to form a layer 82 over the substrate. The substrate comprises a deposition surface 13 on which layer 82 is deposited. Reactant 80 may, for example, correspond to a silicon halide (for instance, $Si_2Cl_6$), and layer 82 may thus comprise a composition containing silicon and halogen (with the halogen corresponding to, for example, chlorine). After layer 82 is formed, any unreacted reactant 80, and/or by-products of formation of layer 82, may be flushed from a reaction chamber comprising the substrate. Subsequently, layer 82 may be exposed to a second reactant to convert the layer to a desired material.

FIG. 5 shows a processing stage at which a material 84 is formed by exposing layer 82 (FIG. 4) to a second reactant 86. If layer 82 comprises silicon and halogen, the second reactant 86 may correspond to water, and may be utilized to form the material 84 to consist of silicon dioxide.

In subsequent processing, any unreacted reactant 86 and/or by-products of formation of material 84 may be flushed from the reaction chamber, and another iteration of the processing of FIGS. 4 and 5 may be utilized to form additional material 84 over substrate 12 (with such additional material being formed using a top surface 85 of the shown material 84 as a deposition surface).

If all of the first reactant is removed prior to the step of FIG. 5, and all of the second reactant is removed after the step of FIG. 5, the process of FIGS. 4 and 5 may be strictly an ALD process. If, however, some of the first reactant remains in the chamber during the flow of the second reactant into the chamber at the processing step of FIG. 5, and/or some of the second reactant from one iteration remains in the chamber during the flow of first reactant into the chamber (i.e., the processing step of FIG. 4) of a subsequent iteration, the process of FIGS. 4 and 5 may correspond to a quasi-ALD process.

In some embodiments, the CVD part of a quasi-ALD process is utilized to obtain an advantage in throughput relative to a strictly ALD process, and temperature control is utilized to avoid the prior art problem of edge-to-center thickness discussed above with reference to FIG. 1.

FIG. 6 diagrammatically illustrates a portion of the heating apparatus 20 (discussed previously with reference to FIG. 2) utilized in accordance with an embodiment. The plurality of semiconductor substrates 42, 44, 46, 48, 50 and 52 is provided within the heating apparatus. Although the heating apparatus is illustrated simultaneously treating a plurality of semiconductor substrates as a batch, in some embodiments a single semiconductor substrate may be individually treated.

Each of the semiconductor substrates comprises an inner region 5 and an outer region 7 laterally outward of the inner region (with the regions 5 and 7 being illustrated for semiconductor substrate 52). The semiconductor substrates may be substantially round when viewed from above (as shown in FIG. 7) so that the outer region radially surrounds the inner region. Each of the substrates also comprises a deposition surface 13 (labeled for the substrate 52). Ultimately, material is to be deposited upon such deposition surfaces.

In operation, an interior of chamber 24 is heated by radiating heat from heating modules (or elements) 26. In the shown embodiment, the modules heat sidewall 22, and the heat is then radiated from the sidewall toward the semiconductor substrates 42, 44, 46, 48, 50 and 52. The radiating heat migrates from an outer region of the chamber toward an inner region of the chamber as represented by arrows 90.

After the heat radiates into the chamber for a period of time, equilibrium is reached within the chamber so that the semiconductor substrates 42, 44, 46, 48, 50 and 52, and anything else within the interior the of chamber, is in thermal equilibrium. However, prior to thermal equilibrium being reached, there will be a horizontal temperature gradient extending from the outer region of the chamber toward the inner region of the chamber. Such temperature gradient will envelop semiconductor substrates 42, 44, 46, 48, 50 and 52 so that the individual semiconductor substrates are not in thermal equilibrium, but rather the outer regions 7 of the semiconductor substrates are warmer than the inner regions 5 of the semiconductor substrates. More specifically, the individual semiconductor substrates 42, 44, 46, 48, 50 and 52 will each comprise a highest-temperature region and a lowest-temperature region; with the highest-temperature regions being in outer regions 7, and the lowest-temperature regions being in inner regions 5.

In some embodiments, it is recognized that the outer regions 7 will have a greater CVD part of a quasi-ALD process than the inner regions, if the substrates are under thermal equilibrium. It is also recognized that higher temperatures may reduce the CVD part of the quasi-ALD process. Thus, at least some the quasi-ALD process is conducted while the substrates are not under thermal equilibrium, and specifically while the outer regions of the substrates are warmer than the inner regions of the substrates. The non-equilibrium in temperature may compensate for there otherwise being a greater CVD part of the quasi-ALD process at the outer regions than at the inner regions, so that problems in WIW uniformity are diminished, or even eliminated.

The quasi-ALD process may include a process of the types described in FIGS. 3-5, and thus may comprise utilizing multiple separate and discrete steps of a deposition sequence to form a composition that extends across surfaces of individual substrates within chamber 24.

There may be a vertical temperature gradient induced in chamber 24 in addition to the horizontal temperature gradient if the upper temperature modules are at a different temperature than the lower temperature modules. Such vertical temperature gradient is diagrammatically illustrated by the arrow 92 in FIG. 6. The vertical temperature gradient may, for example, comprise a higher temperature at the upper semiconductor substrates than at the lower semiconductor substrates. In some embodiments, the vertical gradient may be other than a temperature gradient, and may be a reactant gradient related to pumping efficiency and ratio of wafer area to reactor wall area.

In some embodiments, it is recognized that the upper semiconductor substrates in a batch of semiconductor substrates may have a greater CVD part of a quasi-ALD process than the lower semiconductor substrates, even when the substrates are under thermal equilibrium. It is also recognized that higher temperatures may reduce the CVD part of the quasi-ALD process. Thus, at least some the quasi-ALD process is conducted while the upper substrates are not under thermal equilibrium with the lower substrates, and specifically while the upper substrates are warmer than the lower substrates. The non-equilibrium in temperature may compensate for there otherwise being a greater CVD part of the quasi-ALD process at the upper substrates than at the lower substrates, so that a difference in the thickness of a deposit formed on the upper substrates relative to the thickness of the deposit formed on the lower substrates is diminished, or even eliminated, relative to the difference in such thickness that would occur in conventional processing.

The temperature gradients shown in FIG. 6 are described as being induced by heating modules 26. In some embodiments, other sources of thermal energy may be utilized in addition to, or alternatively to, heating modules 26. For instance, the inlet tubes 28 and 30 (FIG. 2) may be utilized to provide heated reactants and/or heated purge gas into chamber 24, which may provide, or enhance, temperature differentials within the chamber; and/or increase desorption of the reactant monolayer in the outer regions of the wafer. In some embodiments, the heated reactants and/or purge gas may be at a temperature that is higher than a lowest temperature region of a thermal gradient present in the reaction chamber prior to the flow of the reactants and/or purge gas into the chamber.

The temperature utilized within chamber 24 may be any temperature suitable for forming a desired material. For instance, in an example embodiment silicon dioxide is to be formed across deposition surfaces utilizing a quasi-ALD process. The quasi-ALD process utilizes two reactants. A first of the two reactants comprises $Si_2Cl_6$, a second of the two reactants comprises water, and pyridene catalyst is provided with both the first reactant and the second reactant. In such example embodiment, a highest temperature of the deposition surfaces of the non-temperature-equilibrated semiconductor substrates within the chamber may be less than or equal to 90° C., and in some embodiments may be less than or equal to 45° C. In contrast, conventional processes would utilize temperature-equilibrated semiconductor substrates, with such substrates being equilibrated to a temperature of from about 75° C. to about 90° C. Conventional processes may include heating of a deposition chamber for at least about two hours, after placement of semiconductor substrates within the chamber, to achieve equilibrium throughout the chamber prior to introduction of reactants for an ALD or quasi-ALD process. In contrast, in some embodiments in which it takes at least about two hours to reach thermal equilibrium within a reaction chamber (or, in some embodiments, to reach thermal equilibrium between a heated region of the chamber and wafers within the chamber), reactants of an ALD or quasi-ALD process may be introduced into the chamber at least about one hour before thermal equilibrium is reached to form a desired material over the semiconductor substrates while the substrates are not thermally equilibrated.

In some embodiments, an apparatus of the type shown in FIG. 2 is utilized, with one of the reservoirs 32 and 34 holding an ampoule containing hexachlorodisilane ($Si_2Cl_6$), heated to 30° C.-45° C.; and the other reservoir holding water at 20° C.-50° C. Additionally, there is a third reservoir which holds pyridene at 20° C.-40° C. The hexachlorodisilane is introduced into the reaction chamber 24 containing the batch of semiconductor substrates (42, 44, 46, 48, 50 and 52) by flowing nitrogen carrier gas across the hexachlorodisilane to carry some of the hexachlorodisilane into the reaction chamber. The reaction chamber is non-thermally equilibrated with the wafers, and has a highest wafer region temperature therein of less than or equal to 45° C. prior to introduction of the hexachlorodisilane. The hexachlorodisilane is flowed through a delivery line heated to about 60° C.-90° C., and thus is greater than or equal to about 60° C. upon entering the reaction chamber. Simultaneously, pyridene is flowed into the reaction chamber through a delivery line heated to 60° C.-90° C. After a first layer is formed over the deposition surfaces of the substrates from the hexachlorodisilane, at least the majority of the unreacted hexachlorodisilane is flushed from the chamber. Subsequently, the water is flowed into the chamber through a delivery line heated to about 60° C.-90° C., together with pyridene being flowed through the delivery line heated to about 60° C.-90° C. The water converts the first layer to silicon dioxide. If some of the hexachlorodisilane remains in the chamber, the conversion will be a quasi-ALD process. If none of them hexachlorodisilane remains in the chamber when the water is introduced, the conversion may be a strict ALD process.

Subsequent iterations may be conducted in which hexachlorodisilane is introduced into the chamber followed by the water. If water from one iteration remains while hexachlorodisilane is induced in a subsequent iteration, the formation of the silicon dioxide will be a quasi ALD process. It may be advantageous to use a quasi-ALD process at non-equilibrated temperature, in that such may improve throughput relative to a both a strict ALD process and a temperature-equilibrated process, due to decreased purging time and/or elimination of at least some of the time spent waiting for equilibrium of wafer temperatures to occur within a reaction chamber.

In some embodiments, an ALD reaction process has a target equilibrium temperature, and flow of one or more reactants into the ALD chamber is initiated while the wafer temperatures within the chamber are at least 8° C. to 10° C. cooler than the target equilibrium temperature, and before equilibrium is established within the chamber. In such embodiments, one or more of the reactants that is flowed into the chamber may be at a temperature that is at least as high as the target equilibrium temperature. For instance, silicon dioxide may be formed from hexachlorodisilane and water at a target equilibrium temperature of about 75° C. if pyridene catalyst is utilized. In such embodiments, one or more of the hexachlorodisilane, water and pyridene may be introduced into the reaction chamber while wafer temperatures within the chamber are below 65° C., and while a temperature of the introduced material is at least about 75° C.

FIG. 8 shows a semiconductor construction 10 similar to that of FIG. 1, but processed utilizing a temperature differential on a substrate during a quasi-ALD process. The construction comprises the material 14 deposited over a semiconductor substrate 12. The construction FIG. 8 has material 14 with a significantly lower WIW uniformity than the construction of FIG. 1. In some embodiments, the material 14 of FIG. 8 may have a planar topography conformal to the topography of the surface 13 of the underlying substrate 12. The material 14 may be an electrically insulative material, and may, for example, comprise, consist essentially of, or consist of silicon dioxide.

FIG. 8 may be considered to show substrate 12 having a deposition surface 13 that extends across inner region 5 and outer region 7, and to show material 14 deposited on the deposition surface and extending across at least a portion of both the inner region 5 and the outer region 7. In the specific embodiment of FIG. 8, the deposited material 14 extends across an entirety of the inner region 5 and the outer region 7.

The various mechanisms discussed above by which thermal gradients may reduce edge-to-center thickness variation of deposited material are provided to assist the reader in understanding the invention (for instance, the discussion of higher temperature reducing the CVD part of a quasi-ALD process). Such mechanisms are not to limit the claims that follow except to the extent, if any, that the mechanisms are expressly recited in the claims.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor processing method, comprising:
   providing a semiconductor substrate within a heating apparatus, said heating apparatus having a chamber which receives the semiconductor substrate, having a sidewall around the chamber, and having one or more heating modules that heat the sidewall; the semiconductor substrate having a central region radially surrounded by an outer region;
   increasing a temperature within the chamber, the increasing of the temperature comprising passing heat from the sidewall to the semiconductor substrate; the heat migrating from the outer region to the central region;
   while the outer region is not in thermal equilibrium with the central region such that a temperature gradient exists between the outer region and central region with the outer region being warmer than the central region, utilizing multiple separate and substantially discrete steps of a deposition sequence to form a composition that extends across at least a portion of the outer region of the semiconductor substrate and across at least a portion of the central region of the semiconductor substrate; and
   wherein the deposition sequence comprises a combination of atomic layer deposition and chemical vapor deposition, with the chemical vapor deposition being more prevalent along the outer region of the semiconductor substrate than along the central region of the semiconductor substrate; and wherein the non-equilibrium conditions across the outer and central regions of the semiconductor substrate lead to a decrease in a rate of deposition across the outer region relative to a rate of deposition across the central region, and thereby generate a more uniform layer of the composition across the outer and central regions than would be obtained if the outer and central regions were in thermal equilibrium with one another.

2. The method of claim 1 wherein the composition consists of an electrically insulative material, and is formed to be substantially conformal across the semiconductor substrate.

3. The method of claim 1 wherein the deposition sequence uses a silicon precursor as a first reactant and an oxygen precursor as a second reactant, and the composition consists of silicon dioxide.

4. The method of claim 3 further comprising providing a pyridine catalyst with at least one of the first and second reactants in the heating apparatus.

5. The method of claim 4 wherein the composition is formed while a highest temperature of the semiconductor substrate is less than or equal to 90° C.

6. The method of claim 5 wherein the composition is formed while a highest temperature of the semiconductor substrate is less than or equal to 45° C.

7. The method of claim 1 wherein a time to reach thermal equilibrium between the heated sidewall and the semiconductor substrate is at least about 2 hours, and wherein the composition is formed at least about 1 hour before the thermal equilibrium is reached.

8. A semiconductor processing method, comprising:
providing a deposition apparatus comprising a chamber laterally surrounded by a heating element;
placing a stack of semiconductor substrates within the deposition apparatus, individual semiconductor substrates of said stack having inner regions radially surrounded by outer regions;
utilizing the heating element to increase a temperature within the chamber, the increasing of the temperature comprising passing heat through the stack of semiconductor substrates, the heat migrating from the outer regions of the individual substrates to the inner regions;
while the outer regions are not in thermal equilibrium with the inner regions such that a temperature gradient exists between the outer regions and inner regions with the outer regions being warmer than the inner regions, utilizing multiple separate and substantially discrete steps of a deposition sequence comprising atomic layer deposition to form a composition that extends across the outer regions and inner regions of the individual semiconductor substrates; and
wherein the deposition sequence comprises chemical vapor deposition in combination with the atomic layer deposition, with the chemical vapor deposition being more prevalent along the outer regions of the semiconductor substrates than along the inner regions of the semiconductor substrates; and wherein the non-equilibrium conditions across the outer and inner regions of the semiconductor substrates lead to a decrease in a rate of deposition across the outer regions relative to a rate of deposition across the inner regions, and thereby generate a more uniform layer of the composition across the outer and inner regions than would be obtained if the outer and inner regions were in thermal equilibrium with one another.

9. The method of claim 8 wherein the composition consists of silicon dioxide; and wherein the deposition sequence utilizes a silicon-containing first reactant, an oxygen-containing second reactant, and pyridine.

10. The method of claim 8 wherein a time to reach thermal equilibrium between the heating element and the semiconductor substrate is at least about 2 hours, and wherein the composition is formed at least about 1 hour before the thermal equilibrium is reached.

11. The method of claim 8 wherein the composition consists of an electrically insulative material, and is formed to be substantially conformal across the individual semiconductor substrates.

12. The method of claim 11 wherein the composition is formed while a highest temperature of the individual semiconductor substrates is less than or equal to 90° C.

13. The method of claim 12 wherein the composition is formed while a highest temperature of the individual semiconductor substrates is less than or equal to 45° C.

* * * * *